United States Patent
Nanda

(10) Patent No.: US 9,311,445 B2
(45) Date of Patent: Apr. 12, 2016

(54) METHOD, PROCESS, AND SYSTEM FOR HIGH EFFICIENCY GAS TURBINE EXHAUST DUCT FLOW-PATH

(71) Applicant: General Electric Company, Schenectady, NY (US)

(72) Inventor: Deepesh D. Nanda, Karnataka (IN)

(73) Assignee: General Electric Company, Schenectady, NY (US)

(*) Notice: Subject to any disclaimer, the term of this patent is extended or adjusted under 35 U.S.C. 154(b) by 531 days.

(21) Appl. No.: 13/681,630

(22) Filed: Nov. 20, 2012

(65) Prior Publication Data

US 2014/0142898 A1    May 22, 2014

(51) Int. Cl.
| | |
|---|---|
| G06F 17/50 | (2006.01) |
| F01D 25/30 | (2006.01) |
| F02C 6/18 | (2006.01) |
| F15D 1/06 | (2006.01) |
| F02K 1/80 | (2006.01) |

(52) U.S. Cl.
CPC ............ *G06F 17/5086* (2013.01); *F01D 25/30* (2013.01); *F02C 6/18* (2013.01); *G06F 17/50* (2013.01); *F02K 1/80* (2013.01); *F05D 2250/52* (2013.01); *F05D 2270/17* (2013.01); *F15D 1/06* (2013.01); *Y02E 20/16* (2013.01); *Y10S 415/914* (2013.01)

(58) Field of Classification Search
None
See application file for complete search history.

(56) References Cited

U.S. PATENT DOCUMENTS 5,338,155 A    8/1994    Kreitmeier

OTHER PUBLICATIONS

J. I. Madsen, et al., "Response Surface Techniques for Diffuser Shape Optimization," AIAA Journal, vol. 38, No. 9, Sep. 2000, pp. 1512-1518.*
V. Vassiliev, et al., "Experimental and Numerical Investigation of the Impact of Swirl on the Performance of Industrial Gas Turbines Exhaust Diffusers," Proceedings of ASME Turbo Expo 2003 Power for Land, Sea , and Air, Jun. 16-19, 2003, pp. 19-29.*
German, et al., "Effects of diffuser length on the performance of ejectors without induced flow," Report No. TN-61-89, Arnold Engineering Development Center, U.S. Air Force Systems Command, 1961, 45 pages.*
C. Jayatunga, "An Aerodynamic Study of Industrial Gas Turbine Exhaust Turbines," PhD. Thesis, Department of Aeronautical and Automotive Engineering, Loughborough University, 2005, 244 pages.*
V. Vassiliev, et al., "CFD Analysis of Industrial Gas Turbine Exhaust Diffusers," Proceedings of the ASME Turbe Expo 2002, vol. 5, Turbo Expo 2002, Parts A and B, Jun. 3-6, 2002, pp. 995-1013.*

(Continued)

*Primary Examiner* — Aniss Chad
*Assistant Examiner* — David M Rogers
(74) *Attorney, Agent, or Firm* — Ernset G. Cusick; Frank A. Landgraff

(57) ABSTRACT

Methods, systems, and apparatuses for high efficiency exhaust duct flow path. In an embodiment, an exhaust duct flow path may be created by calculating the efficiency of an exhaust duct flow path with an initial measurement. The initial measurement may be changed and the efficiency analyzed. Then the efficiency of the exhaust duct flow path with the changed measurement may be compared to the efficiency of the exhaust duct flow path with the initial measurement.

18 Claims, 6 Drawing Sheets

(56) References Cited

OTHER PUBLICATIONS

S. Singh, et al., "Effect of Inlet Swirl on the Performance of Annular Diffusers Having the Same Equivalent Cone Angle," Proceedings of the Institution of Mechanical Engineers, Apr. 2006, vol. 220, No. 2, pp. 129-143.*

B. Djebedjian, "Two-Dimensional Diffuser Shape Optimization," Proceedings of IMEC2004, International Mechanical Engineering Conference, Dec. 5-8, 2004, 19 pages.*

* cited by examiner

METHOD, PROCESS, AND SYSTEM FOR HIGH EFFICIENCY GAS TURBINE EXHAUST DUCT FLOW-PATH

TECHNICAL FIELD

The technical field generally relates to gas turbines and more specifically relates to exhaust duct flow paths.

BACKGROUND

Power generation plants, such as combined cycle power plants, often incorporate a gas turbine engine. The gas turbine engine combusts a fuel to generate hot combustion gases which flow through a turbine to drive a load, e.g., an electrical generator. At high velocities and temperatures, an exhaust gas exits the turbine and enters an exhaust diffuser. Exhaust diffusers convert the kinetic energy of the flow exiting the turbine last stage bucket into potential energy in the form of increased static pressure. This is accomplished by conducting the flow through a duct of increasing cross-sectional area. Although there is a benefit for exhaust diffusers in power generation, exhaust diffusers may contribute to approximately 50% of the length of a gas turbine. The length may consume valuable space in the power plant that may be used for other purposes, such as additional power generation equipment.

BRIEF DESCRIPTION OF THE INVENTION

Disclosed herein are methods, processes, and systems for high efficiency exhaust duct flow path. In an embodiment, a method includes determining a first exhaust duct flow path of a gas turbine, the first exhaust duct flow path separated into a plurality of stations, determining a first casing angle of a first station of the plurality of stations, analyzing the first exhaust duct flow path comprising the first casing angle of the first station of the plurality of stations the first exhaust duct flow path, changing the first casing angle of the first station to a second casing angle of the first station, analyzing the first exhaust duct flow path comprising the second casing angle, determining that the first exhaust duct flow path with the second casing angle is more efficient than the first exhaust duct flow path with the first casing angle, and creating the first exhaust duct flow path with the second casing angle.

In an embodiment, a process for fabricating an exhaust duct flow path comprising the steps of calculating parameters for a first exhaust duct flow path of a gas turbine, the first exhaust duct flow path separated into a plurality of stations, analyzing an efficiency of the first exhaust duct flow path comprising a first measurement of a first station of the plurality of stations for the first exhaust duct flow path, changing the first measurement of the first station to a second measurement of the first station, analyzing an efficiency of the first exhaust duct flow path comprising the second measurement, and determining that the first exhaust duct flow path with the second measurement is more efficient than the first exhaust duct flow path with the first measurement.

In an embodiment, a system comprising a processor adapted to execute computer-readable instructions, and a memory communicatively coupled to said processor. The memory having stored therein computer-readable instructions that, if executed by the processor, cause the processor to perform operations comprising determining a first exhaust duct flow path of a gas turbine, the first exhaust duct flow path separated into a plurality of stations, determining a first casing angle of a first station of the plurality of stations, analyzing the first exhaust duct flow path comprising the first casing angle of the first station of the plurality of stations the exhaust duct flow path, changing the first casing angle of the first station to a second casing angle of the first station, analyzing the first exhaust duct flow path comprising the second casing angle, determining that the first exhaust duct flow path with the second casing angle is more efficient than the first exhaust duct flow path with the first casing angle, and creating the first exhaust duct flow path with the second casing angle.

BRIEF DESCRIPTION OF THE DRAWINGS

A more detailed understanding may be had from the following description, given by way of example in conjunction with the accompanying drawings wherein.

DETAILED DESCRIPTION OF THE INVENTION

Traditionally, exhaust duct flow path is designed for full speed full load—International Standards Organization (FSFL-ISO) performance with flat or very steep angle centerbody and non-optimum outer wall (casing). With plant performance critical to quality (CTQ) broadened to have not only FSFL-ISO, but also cold day and part load, exhaust duct flow path design may be challenging. Embodiments disclosed herein allow high efficiency exhaust duct flow path designs that may cater not only to FSFL-ISO, but other operating conditions. Traditionally when an increase in the performance of the exhaust diffuser is desired, the length of exhaust duct flow path would be increased at the same time. As disclosed herein, performance may be significantly increased, while also decreasing the length of the exhaust duct.

Optimization of the exhaust duct flow path design is a way of enhancing the turbine component, and therefore the gas turbine system performance. Exhaust duct flow path design thus may help high efficiency plant performance as well as minimize or decrease the length of the exhaust duct flow path. The exhaust duct may be delineated into a plurality of sections. The sections may be recursively tested to configure an optimal casing angle and length for each section.

Figure 1:
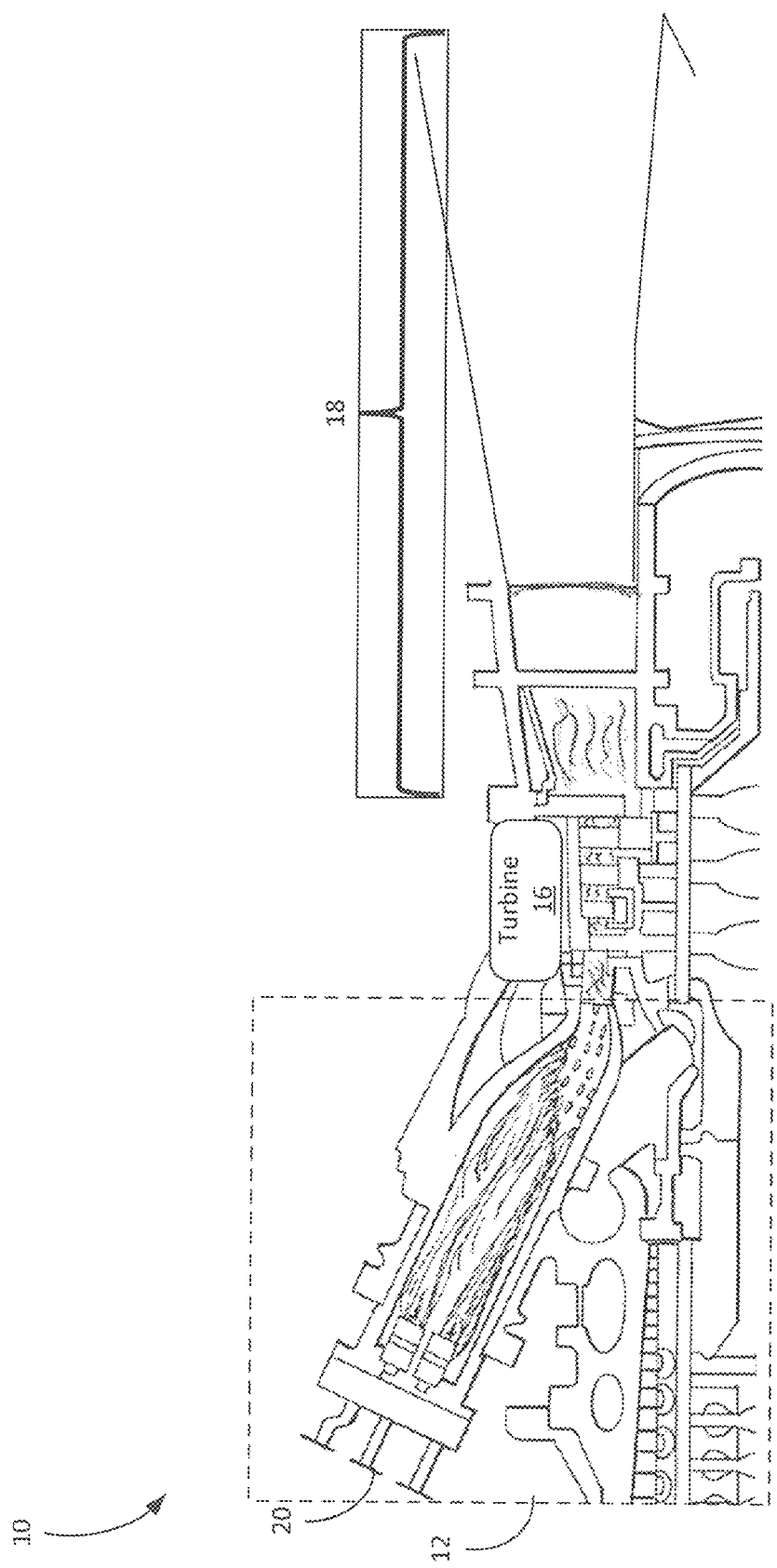
FIG. 1 is an exemplary illustration of a cross section of a gas turbine.

FIG. 1 is an exemplary illustration of a cross section of a gas turbine. As shown in FIG. 1, a gas turbine 10 has a combustion section 12 and a turbine 16. The combustion section 12 may include an annular array of combustion chambers combustion cans 20. The turbine 16 is coupled to rotationally drive the compressor (not shown) and a power output drive shaft (not shown). Air enters the gas turbine 10 and passes through the compressor. High pressure air from the compressor enters the combustion section 12 where it is mixed with fuel and burned via the combustion cans (e.g., combustion can 20). High energy combustion gases exit the combustion section 12 to power the turbine 16 which, in turn, drives the compressor and the output power shaft. The combustion gases exit the turbine 16 through the exhaust duct flow path 18 and may enter into a heat recovery steam generator (HRSG) to extract additional energy from the exhaust gas.

Figure 2:
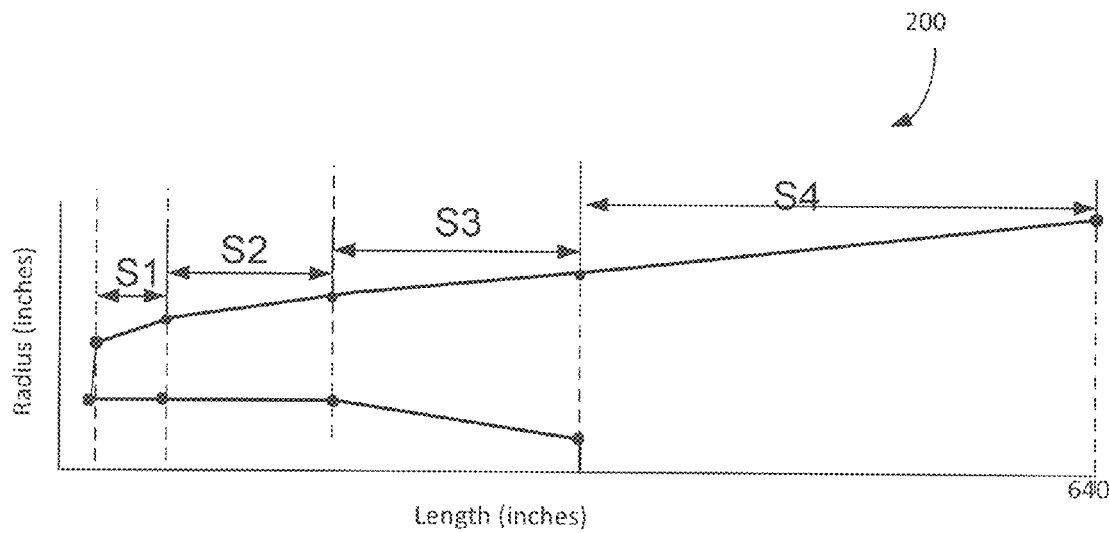
FIG. 2 is an exemplary illustration of a flow path of an exhaust duct.
Figure 3:
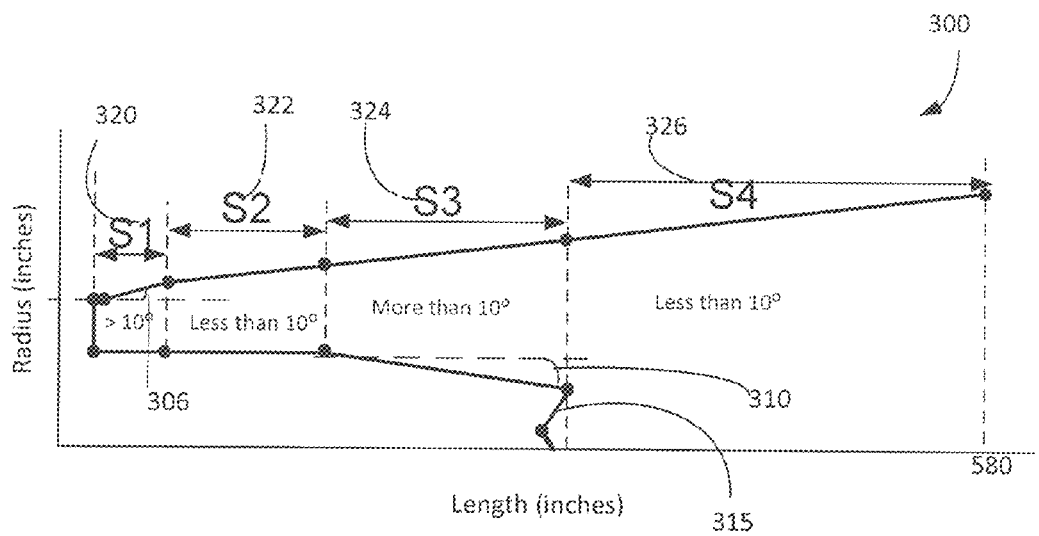
FIG. 3 is an exemplary illustration of a flow path of an exhaust duct.

FIG. 2 and FIG. 3 are exemplary illustrations of exhaust duct flow paths. As shown in FIGS. 2 and 3, an exhaust duct flow path may be divided into a plurality of sections (e.g., four stations), wherein each station may have an angle for an exhaust duct flow path casing (outer radius). For example, exhaust duct flow path 200 may be a baseline flow path. Discussed in more detail herein, exhaust duct flow path 300 may be considered a more efficient version of the baseline exhaust duct flow path 200. The station angles, as described herein, are relative to the center line of the exhaust gas diffuser.

Figure 4:
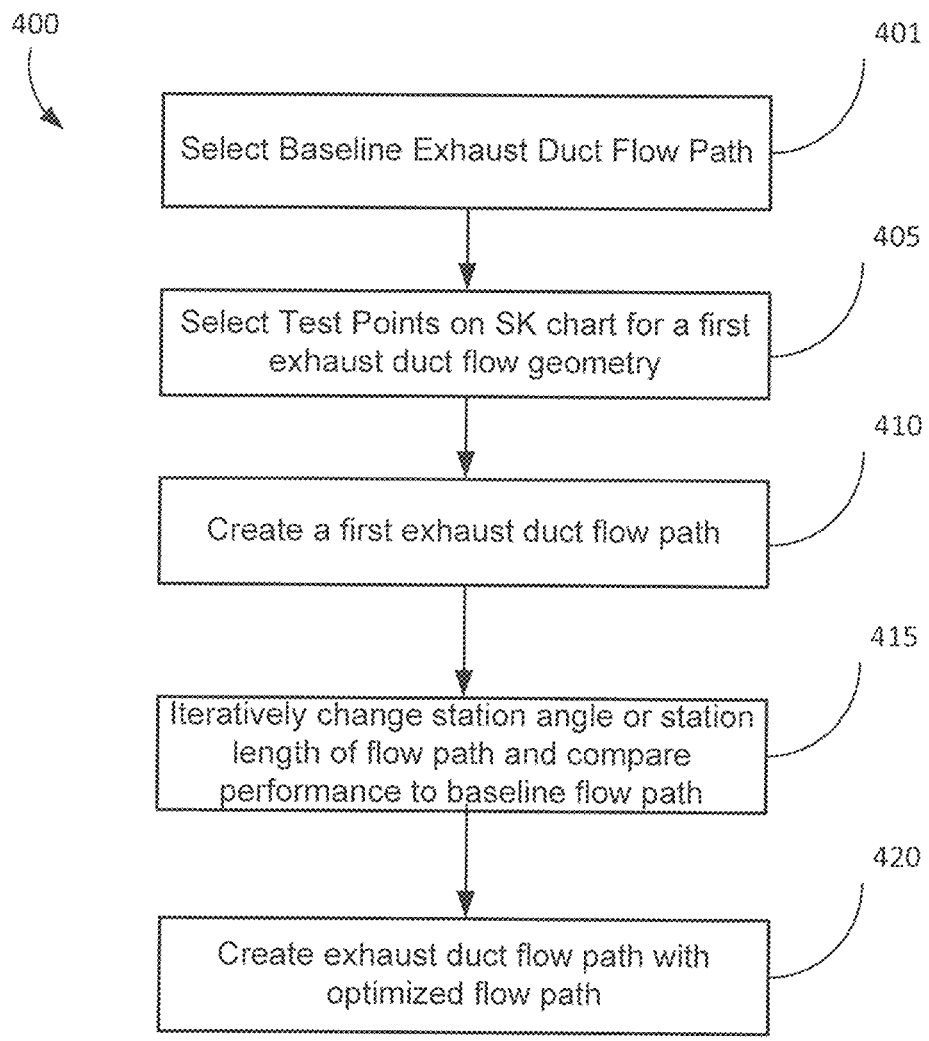
FIG. 4 illustrates a non-limiting, exemplary method of creating a high efficiency gas turbine exhaust duct flow-path.
Figure 5:
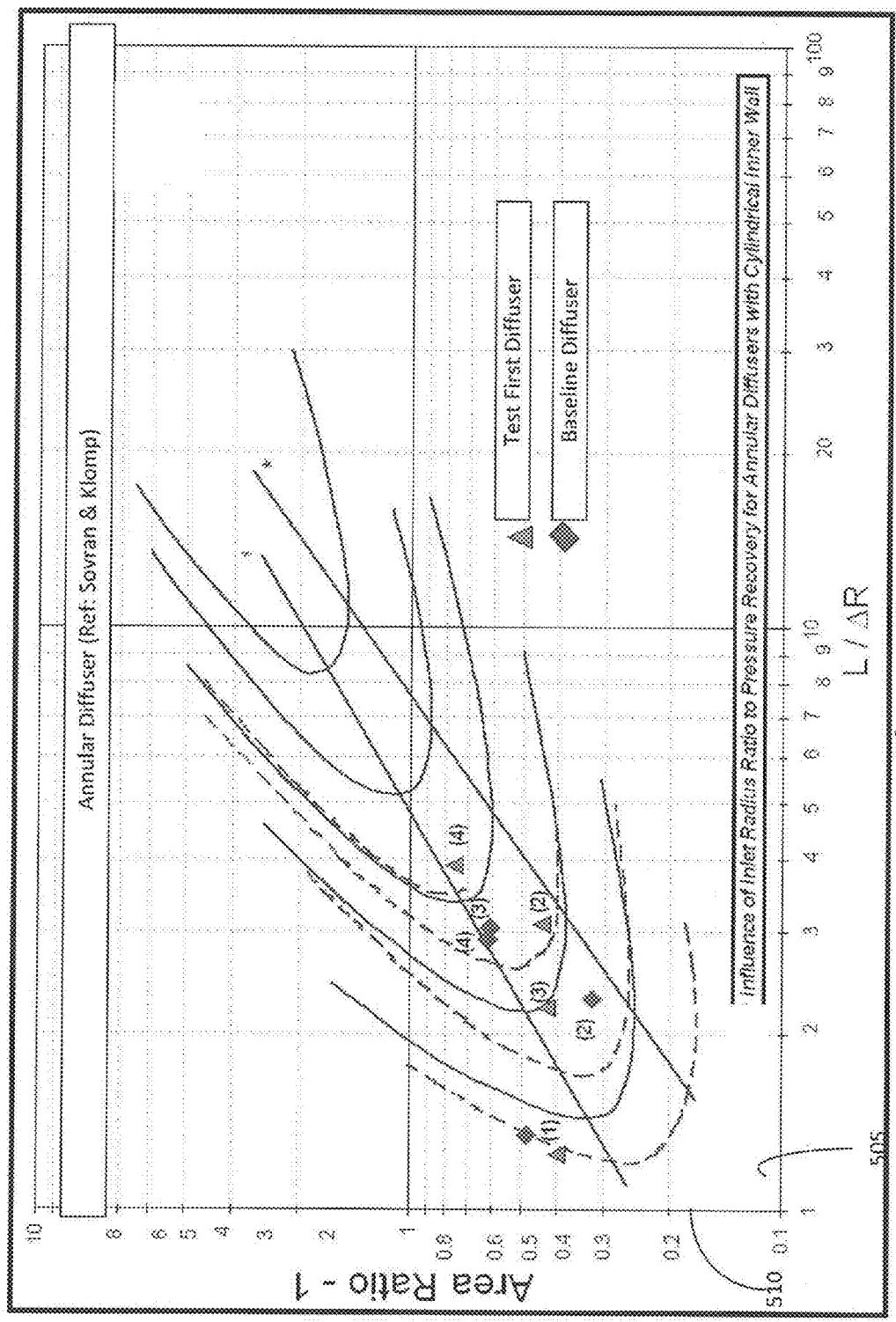
FIG. 5 is an exemplary illustration of a Sovran and Klomp chart with parameters for a high efficiency gas turbine exhaust duct flow path and a baseline exhaust duct flow path.

FIG. 4 is an exemplary method 400 for designing and creating a high efficiency gas turbine exhaust duct flow path. Method 400 may be performed in whole or in part by computing equipment including servers or any other device that can execute computing functions. In an embodiment, at Step 401, a baseline exhaust duct flow path geometry may be selected. The exhaust duct flow path geometry may be split into a plurality of stations (sections). At Step 405, a chart such as the Sovran and Klomp chart (SK chart) shown in FIG. 5 may be used to compare the baseline to a selected set of points (stations) for an optimized exhaust duct flow path geometry (e.g., FIG. 3). The baseline station measurements may be of a preexisting exhaust duct flow path design. Exhaust duct flow path 200 is an example of a baseline exhaust duct flow path that may be used in method 400. Each of the stations may be initially plotted on an SK chart for relative comparison of design. With reference to FIG. 5, the x-axis 505 is L/delta R where L is the length of the exhaust duct and Delta R is the outer radius minus the inner radius at the inlet of the exhaust duct. The y-axis 510 is the area ratio minus 1. The area ratio is the outlet area minus the inlet area. If the length of each station of the exhaust duct flow path and the area ratio of each station of the exhaust duct flow path is known, then exhaust duct flow path geometry may be created.

At Step 410, a first exhaust duct flow path flow path may be created based on the SK chart. At Step 415, the first exhaust duct flow path, which may have multiple stations (e.g., four stations), may be iteratively changed in length or angle. The change may occur for each station. After each angle or length change the performance of the exhaust duct flow path may be tested in comparison to the baseline exhaust duct flow path. Computational fluid dynamics (CFD) may be used to analyze the exhaust duct flow path.

For example, with regard to the use of CFD, at a particular angle the high efficiency exhaust duct flow path may be tested and compared to the baseline exhaust duct flow path using the resulting compressible static pressure restoring coefficient (Cp) of each flow path. The performance equation, or Cp, is equal to the (outlet static pressure-inlet static pressure)/(inlet total pressure-inlet static pressure). The outlet may be defined at one-inch intervals, for example, and compared to the baseline. The measurement and comparison of Cp may be done iteratively at a particular length using different angles or at a particular angle using different lengths. The angle or length may be changed based on the test results. Tests can be performed in hardware or software computer simulation. Cp measurement at every one-inch location may assist in determining the parameters to change, if any, in each station. The change of angles changes the flow within the exhaust duct flow path and the angles may be changed to better navigate the flow around blockages (e.g., a strut) in the exhaust duct flow path. The change of angles and length may ultimately increase the performance of the exhaust duct flow path. At Step 420, a high efficiency flow path may be physically or digitally created.

There is a general approach that may be taken to design and create a high efficiency gas turbine exhaust duct flow path as discussed herein. Referring again to FIG. 3, in an embodiment, for example, exhaust duct flow path 200, S1 and S2 may be redesigned for loss reduction through early diffusion, while S3 and S4 may be redesigned to maximize performance and length reduction. In an embodiment, an exhaust duct flow path may be designed in such a way that the angle of S1 may be highly aggressive to reduce the mach number before strut blockage. The highly aggressive angle may be considered the design for which the duct outer wall angle is higher than the traditional wall angle of approximately 10 degrees. The use of a highly aggressive angle, if done without proper engineering judgment, may lead to the flow separation from the wall which in turn may drastically drop diffuser performance The S2 angle may be designed to be less aggressive to improve part-load performance. The less aggressive angle may be considered to be less than 10 degrees for the outer wall angle. S3 may be designed to have robust diffuser performance across operating conditions. Robust diffuser performance may be a diffuser which retains its performance in spite of changes within tolerance limit in upstream or downstream component behavior. The angle at S3, may also be highly aggressive. S4 may be designed to have an efficient and smooth transition to the HRSG, which may include a less aggressive angle. Flow leaving from an exhaust diffuser to HRSG should be well uniform and within the limiting velocity for life and efficiency of the HRSG (e.g., an efficient and smooth transition).

FIG. 3 is an example of a more efficient exhaust duct flow path 300 compared to the baseline exhaust duct flow path 200. The totality of the effect of a tailored angle and corresponding length for each station as disclosed herein, may allow for a more efficient and shorter exhaust duct flow path. In an embodiment, station 1 (S1) 320 may have a casing (outer wall) angle 306 of greater than 10 degrees relative to the center line of the exhaust gas diffuser. S2 322 may have a casing angle of less than 10 degrees relative to the center line of the exhaust gas diffuser. S3 324 may have a casing angle of greater than 10 degrees relative to the center line of the exhaust gas diffuser. S4 326 may have a casing angle of less than 10 degrees relative to the center line of the exhaust gas diffuser.

In an embodiment of a more efficient exhaust duct flow path 300, S3 also may have a bottom angle 310 which may be less than 10 degrees. The bottom segment of S3 may connect with a vortex strap 315 which may also increase the performance of the diffuser. As the flow passes over a center-body and enters into diffuser dump, there may be a center-body wake from a backward facing center-body step. The wake may climb the center-body wall and balloon up to lift up the flow. The unique shape of a vortex strap may stop the flow from climbing or ballooning up the wall. The vortex strap also may minimize the vortex size and entrain the main flow towards the hub thereby making the hub flow field stronger for more robust diffuser performance. The combination of the vortex strap and the other design elements described herein may considerably improve the efficiency of the exhaust duct flow path.

Figure 6:
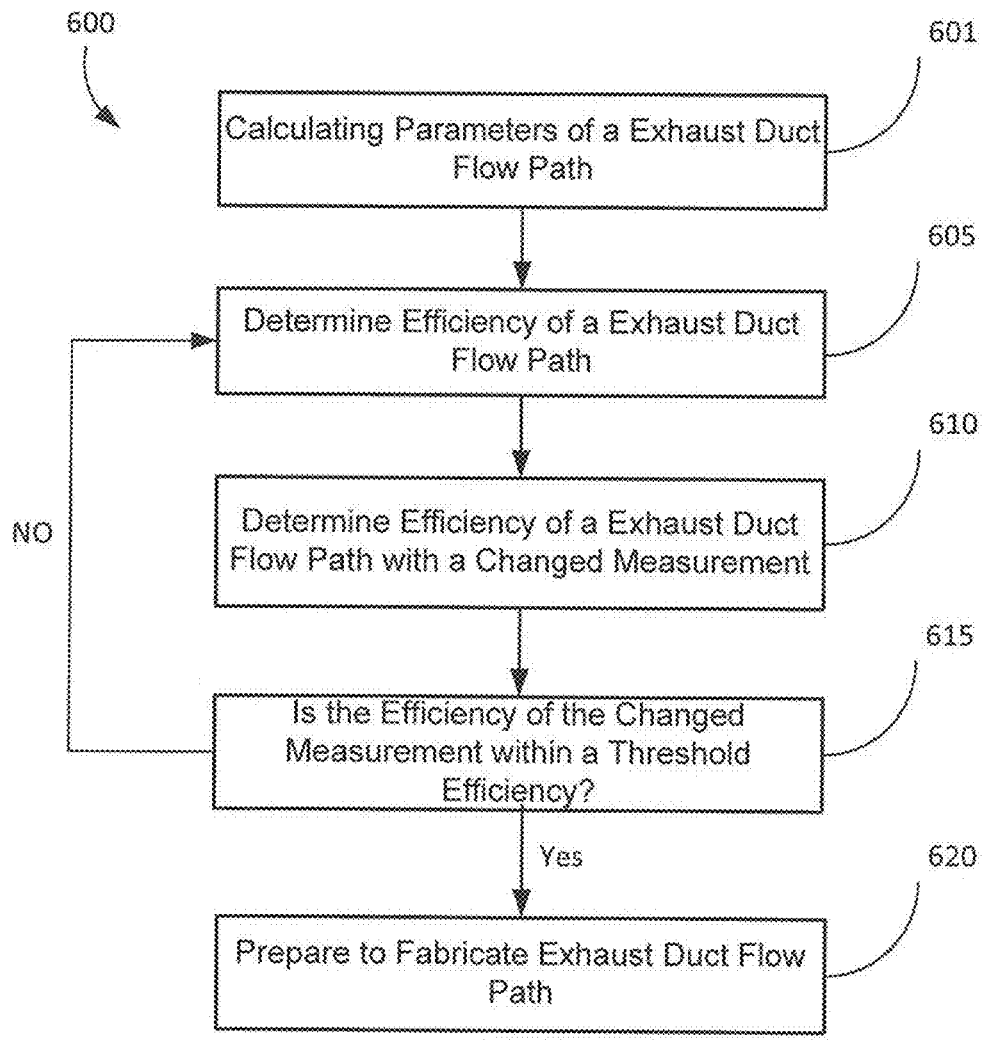
FIG. 6 illustrates a non-limiting, exemplary method of creating a high efficiency gas turbine exhaust duct flow-path.

FIG. 6 is another exemplary method of designing or creating a high efficiency gas turbine exhaust duct flow path. At Step 601, paramaters may be calculated for a first exhaust duct flow path of a gas turbine (e.g., a baseline flow path), wherein the first exhaust duct flow path may be separated into a plurality of stations. At Step 605, the efficiency of the first exhaust duct flow path with an initial measurement may be determined. At Step 610, the initial measurement of the first station may be changed and the efficiency of the first exhaust duct flow path with the changed measurement may be determined At Step 615, determine if the efficiency of the second measurement is less than a threshold efficiency. If not less than the threshold efficiency, then continue with steps 605 and 610. If within threshold, then prepare to fabricate the exhaust duct flow path at 620. A similuation may include measurements from implemented physical exhaust duct flow paths and associated turbine equipment. Parameters in fabricating the physical exhaust duct flow path may include general dimensions of the exhaust duct flow path, location of stations, and where the exhaust duct flow path may attach to other turbine equipment. Parameters may include a graphical drawing in multiple dimensions and view points of what the physical exhaust duct flow path may look like if fabricated. Measurements may comprise angle (e.g., casing angle) or length of a section or other relevant portions of the exhaust duct flow path.

The design methods and systems, as discussed herein, may create a more efficient duct flow path that includes a shorter duct length as compared to a baseline flow path. Examples of the efficiency and design gains are evident when comparing the exhaust duct flow paths 200 and 300. More efficient performance may occur across a range of hot and cold operating conditions with a reduced length compared to a baseline. The combination of elements such as the vortex strap and composition of each station (i.e., length and angle) may assist in efficiency gains. In an embodiment of the high efficiency flow path, there was approximately 3.5 MW of power gain at FSFL-ISO with better performance across operating conditions compared to a baseline duct flow path.

In an embodiment, the more efficient exhaust duct flow path was shorter than the baseline exhaust duct flow path by approximately 10 percent. The exhaust diffuser performance roll-up of a high efficiency exhaust diffuser and a baseline exhaust diffuser (e.g., prior art), and the high efficiency exhaust duct flow path has been tested. The high efficiency exhaust duct flow path, as described herein, has outperformed the baseline exhaust duct flow path over an entire range of exhaust duct swirl angles (e.g., different performance loads). For example, at an exhaust duct inlet swirl angle of −20 degrees the overall compressible static pressure restoring coefficient (Cp) for the baseline exhaust duct flow path was approximately 0.5 while the high efficiency exhaust duct flow path was significantly better at approximately 0.8.

Without in any way limiting the scope, interpretation, or application of the claims appearing herein, a technical effect of one or more of the example embodiments disclosed herein is to provide adjustments to the design of an exhaust duct flow path to increase efficiency. Another technical effect of one or more of the embodiments disclosed herein is that the high efficiency exhaust duct flow path design may be approximately 10% shorter in length than a baseline duct flow path, which may be mechanically cost effective for manufacturing while increasing performance across operating conditions, as discussed herein. In an embodiment, relative to baseline, a gain of 3.5 MW of power at FSFL-ISO was observed. With the high efficiency exhaust duct flow path, the static pressure at turbine exit drops may in turn lead to a drop in turbine exit total pressure that may allow the turbine to expand more and thereby increase the overall gas turbine power output for the same fuel injection.

An exhaust duct flow path as mentioned herein may be a physical manifestation (e.g., metal) or a computer generated representation of an exhaust duct flow path in a turbine system. Tests of the exhaust duct flow path may be done using physical exhaust duct flow path with test equipment, computer specifications of an exhaust duct flow path and corresponding computer analysis, or the like. Tests may be done on a particular exhaust duct flow path design, such as an exhaust duct made for one or more generator models, and implemented into a physical form or digital representation of a physical exhaust duct flow path. Simulations of an exhaust duct flow path, for example, may be done using measurements from implementations of exhaust duct flow paths.

Figure 7:
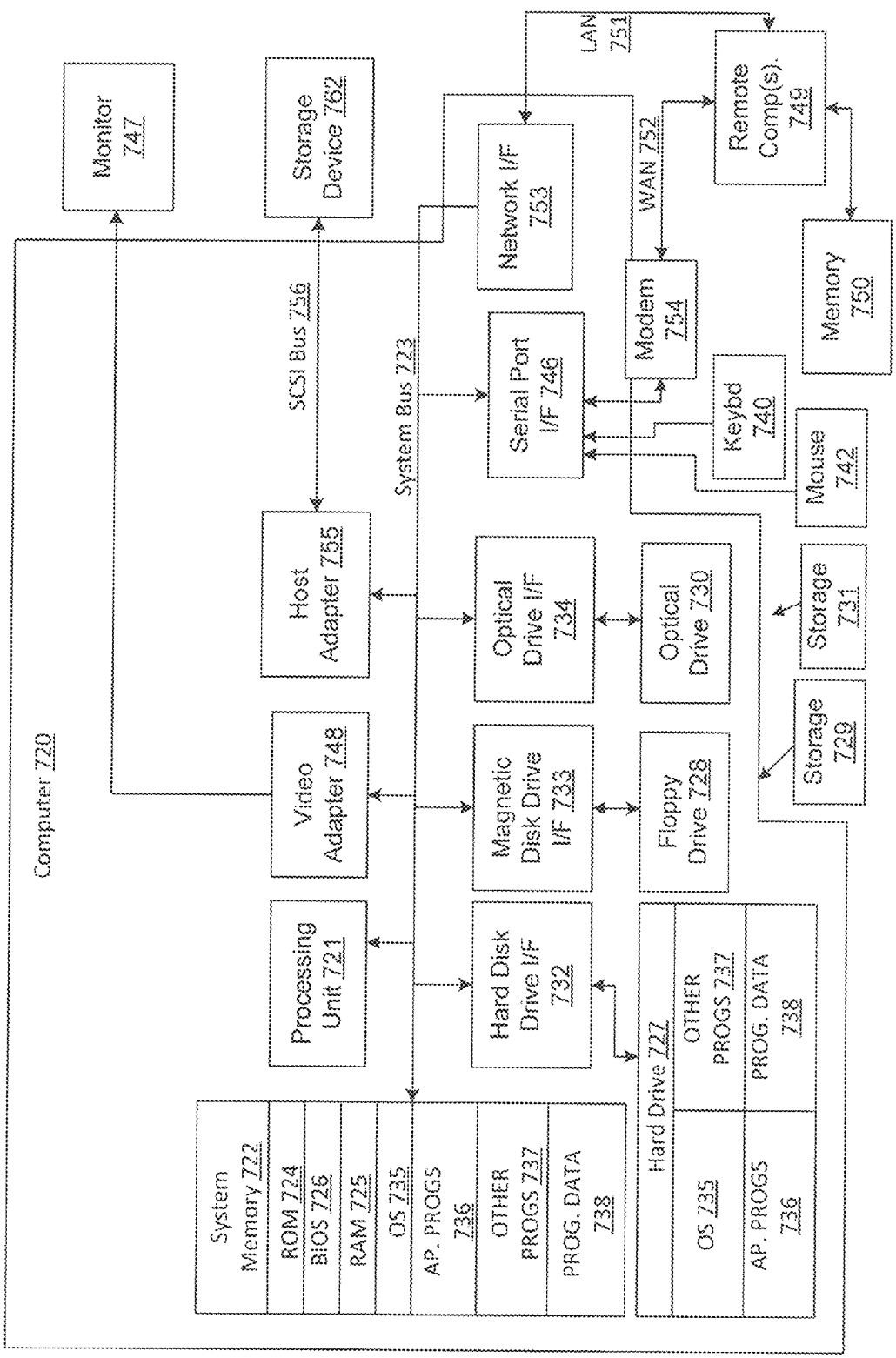
FIG. 7 is an exemplary block diagram representing a general purpose computer system in which aspects of the methods and systems disclosed herein or portions thereof may be incorporated.

FIG. 7 and the following discussion are intended to provide a brief general description of a suitable computing environment in which the methods and systems disclosed herein and/or portions thereof may be implemented. Although not required, the methods and systems disclosed herein are described in the general context of computer-executable instructions, such as program modules, being executed by a computer, such as a client workstation, server or personal computer. Generally, program modules include routines, programs, objects, components, data structures and the like that perform particular tasks or implement particular abstract data types. Moreover, it should be appreciated the methods and systems disclosed herein and/or portions thereof may be practiced with other computer system configurations, including hand-held devices, multi-processor systems, microprocessor-based or programmable consumer electronics, network PCs, minicomputers, mainframe computers and the like. The methods and systems disclosed herein may also be practiced in distributed computing environments where tasks are performed by remote processing devices that are linked through a communications network. In a distributed computing environment, program modules may be located in both local and remote memory storage devices.

FIG. 7 is a block diagram representing a general purpose computer system in which aspects of the methods and systems disclosed herein and/or portions thereof may be incorporated. As shown, the exemplary general purpose computing system includes a computer 720 or the like, including a processing unit 721, a system memory 722, and a system bus 723 that couples various system components including the system memory to the processing unit 721. The system bus 723 may be any of several types of bus structures including a memory bus or memory controller, a peripheral bus, and a local bus using any of a variety of bus architectures. The system memory includes read-only memory (ROM) 724 and random access memory (RAM) 725. A basic input/output system 726 (BIOS), containing the basic routines that help to transfer information between elements within the computer 720, such as during start-up, is stored in ROM 724.

The computer 720 may further include a hard disk drive 727 for reading from and writing to a hard disk (not shown), a magnetic disk drive 728 for reading from or writing to a removable magnetic disk 729, and an optical disk drive 730 for reading from or writing to a removable optical disk 731 such as a CD-ROM or other optical media. The hard disk drive 727, magnetic disk drive 728, and optical disk drive 730 are connected to the system bus 723 by a hard disk drive interface 732, a magnetic disk drive interface 733, and an optical drive interface 734, respectively. The drives and their associated computer-readable media provide non-volatile storage of computer readable instructions, data structures, program modules and other data for the computer 720.

Although the exemplary environment described herein employs a hard disk, a removable magnetic disk 729, and a removable optical disk 731, it should be appreciated that other types of computer readable media which can store data that is accessible by a computer may also be used in the exemplary operating environment. Such other types of media include, but are not limited to, a magnetic cassette, a flash memory card, a digital video or versatile disk, a Bernoulli cartridge, a random access memory (RAM), a read-only memory (ROM), and the like.

A number of program modules may be stored on the hard disk, magnetic disk 729, optical disk 731, ROM 724 or RAM 725, including an operating system 735, one or more application programs 736, other program modules 737 and program data 738. A user may enter commands and information into the computer 720 through input devices such as a keyboard 740 and pointing device 742. Other input devices (not shown) may include a microphone, joystick, game pad, satellite disk, scanner, or the like. These and other input devices are often connected to the processing unit 721 through a serial port interface 746 that is coupled to the system bus, but may be connected by other interfaces, such as a parallel port, game port, or universal serial bus (USB). A monitor 747 or other type of display device is also connected to the system bus 723 via an interface, such as a video adapter 748. In addition to the monitor 747, a computer may include other peripheral output devices (not shown), such as speakers and printers. The exemplary system of FIG. 7 also includes a host adapter 755, a Small Computer System Interface (SCSI) bus 756, and an external storage device 762 connected to the SCSI bus 756.

The computer 720 may operate in a networked environment using logical connections to one or more remote computers, such as a remote computer 749. The remote computer 749 may be a personal computer, a server, a router, a network PC, a peer device or other common network node, and may include many or all of the elements described above relative to the computer 720, although only a memory storage device 750 has been illustrated in FIG. 7. The logical connections depicted in FIG. 7 include a local area network (LAN) 751 and a wide area network (WAN) 752. Such networking environments are commonplace in offices, enterprise-wide computer networks, intranets, and the Internet.

When used in a LAN networking environment, the computer 720 is connected to the LAN 751 through a network interface or adapter 753. When used in a WAN networking environment, the computer 720 may include a modem 754 or other means for establishing communications over the wide area network 752, such as the Internet. The modem 754, which may be internal or external, is connected to the system bus 723 via the serial port interface 746. In a networked environment, program modules depicted relative to the computer 720, or portions thereof, may be stored in the remote memory storage device. It will be appreciated that the network connections shown are exemplary and other means of establishing a communications link between the computers may be used.

Computer 720 may include a variety of computer readable storage media. Computer readable storage media can be any available media that can be accessed by computer 720 and includes both volatile and nonvolatile media, removable and non-removable media. By way of example, and not limitation, computer readable media may comprise computer storage media and communication media. Computer storage media include both volatile and nonvolatile, removable and non-removable media implemented in any method or technology for storage of information such as computer readable instructions, data structures, program modules or other data. Computer storage media include, but are not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by computer 720. Combinations of any of the above should also be included within the scope of computer readable media that may be used to store source code for implementing the methods and systems described herein. Any combination of the features or elements disclosed herein may be used in one or more embodiments.

In describing preferred embodiments of the subject matter of the present disclosure, as illustrated in the Figures, specific terminology is employed for the sake of clarity. The claimed subject matter, however, is not intended to be limited to the specific terminology so selected, and it is to be understood that each specific element includes all technical equivalents that operate in a similar manner to accomplish a similar purpose.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed:

1. A method for creating an exhaust duct for a gas turbine, the method comprising:
    i) determining a first exhaust duct flow path of a gas turbine, the first exhaust duct flow path separated into a plurality of stations;
    ii) determining a first casing angle of a first station of the plurality of stations;
    iii) analyzing the first exhaust duct flow path using the first casing angle of the first station;
    iv) changing the first casing angle of the first station to a second casing angle of the first station;
    v) analyzing the first exhaust duct flow path using the second casing angle;
    determining that the first exhaust duct flow path with the second casing angle is more efficient than the first exhaust duct flow path with the first casing angle; and
    repeating ii) through v) for each subsequent station of the plurality of stations; and
    creating the first exhaust duct flow path with the second casing angle, and creating an exhaust duct for a gas turbine.

2. The method of claim 1, wherein the plurality of stations comprises at least three stations.

3. The method of claim 1, wherein the first casing angle of the first station is measured relative to a center line of an exhaust diffuser.

4. The method of claim 1, wherein more efficient comprises a higher value of a compressible static pressure restoring coefficient for the first exhaust duct flow path with the second casing angle in comparison to a value of a compressible static pressure restoring coefficient of the first exhaust duct flow path with the first casing angle.

5. The method of claim 4, wherein the compressible static pressure restoring coefficient is measured in relation to at least one of a diffuser inlet swirl angle or length of an exhaust duct flow path.

6. The method of claim 1, further comprising changing a first length of the first station to a second length of the first station.

7. The method of claim 1, further comprising fabricating a second exhaust duct flow path comprising the second casing angle of the first station, wherein the second exhaust duct flow path is more efficient than the first exhaust duct flow path with the first casing angle.

8. A process for determining and fabricating an exhaust duct flow path comprising the steps of:
   i) calculating parameters for a first exhaust duct flow path of a gas turbine, the first exhaust duct flow path separated into a plurality of stations;
   ii) analyzing an efficiency of the first exhaust duct flow path comprising a first measurement of a first station of the plurality of stations for the first exhaust duct flow path;
   iii) changing the first measurement of the first station to a second measurement of the first station;
   iv) analyzing an efficiency of the first exhaust duct flow path comprising the second measurement; and
   v) determining that the first exhaust duct flow path with the second measurement is more efficient than the first exhaust duct flow path with the first measurement and repeating ii) through v) for each subsequent station of the plurality of stations; and
   fabricating an exhaust duct flow path according to the determining that the first exhaust duct flow path with the second measurement is more efficient than the first exhaust duct flow path with the first measurement and fabricating an exhaust duct for a gas turbine.

9. The process of claim 8, wherein the plurality of stations comprises at least three stations.

10. The process of claim 8, wherein the first measurement of the first station is measured relative to a center line of an exhaust diffuser.

11. The process of claim 8, wherein more efficient comprises a higher value of a compressible static pressure restoring coefficient for the first exhaust duct flow path with the second measurement in comparison to a value of a compressible static pressure restoring coefficient of the first exhaust duct flow path with the first measurement.

12. The process of claim 11, wherein the compressible static pressure restoring coefficient is measured in relation to at least one of an exhaust duct inlet swirl angle or length of an exhaust duct flow path.

13. The process of claim 8, wherein first measurement or second measurement comprise at least one of: a length or a casing angle.

14. The process of claim 13, wherein a first length of the first station is changed to a second length of the first station.

15. A system for creating an exhaust duct for a gas turbine, the system comprising:
   a processor adapted to execute computer-readable instructions; and
   a memory communicatively coupled to said processor, said memory having stored therein computer-readable instructions that, if executed by the processor, cause the processor to perform operations comprising:
   i) determining a first exhaust duct flow path of a gas turbine, the first exhaust duct flow path separated into a plurality of stations;
   ii) determining a first casing angle of a first station of the plurality of stations;
   iii) analyzing the first exhaust duct flow path using the first casing angle of the first station;
   iv) changing the first casing angle of the first station to a second casing angle of the first station;
   v) analyzing the first exhaust duct flow path using the second casing angle;
   determining that the first exhaust duct flow path with the second casing angle is more efficient than the first exhaust duct flow path with the first casing angle; and
   repeating ii) through v) for each subsequent station of the plurality of stations; and
   creating the first exhaust duct flow path with the second casing angle.

16. The system of claim 15, further comprising a physical exhaust duct flow path fabricated in line with created parameters for the first exhaust duct flow path with the second casing angle.

17. The system of claim 16, wherein the first casing angle of the first station is measured relative to a center line of an exhaust diffuser.

18. The system of claim 15, wherein the first exhaust duct flow path comprises a digital manifestation.

* * * * *